(12) United States Patent
Puyt et al.

(10) Patent No.: US 8,792,085 B2
(45) Date of Patent: Jul. 29, 2014

(54) LITHOGRAPHIC APPARATUS, SUBSTRATE TABLE, AND METHOD FOR ENHANCING SUBSTRATE RELEASE PROPERTIES

(75) Inventors: Michiel Puyt, Veldhoven (NL); Arno Jan Bleeker, Westerhoven (NL); Rene Theodorus Petrus Compen, Valkenswaard (NL); Rudolf Hartmut Fischer, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 314 days.

(21) Appl. No.: 12/856,106

(22) Filed: Aug. 13, 2010

(65) Prior Publication Data

US 2010/0296073 A1    Nov. 25, 2010

Related U.S. Application Data

(63) Continuation of application No. 11/645,812, filed on Dec. 27, 2006, now Pat. No. 7,791,708.

(51) Int. Cl.
*G03B 27/58* (2006.01)
*G03F 7/20* (2006.01)
*H01L 21/687* (2006.01)

(52) U.S. Cl.
CPC ............ *G03F 7/707* (2013.01); *G03F 7/70708* (2013.01); *H01L 21/68757* (2013.01)
USPC .............................................. 355/72; 355/53

(58) Field of Classification Search
CPC . G03F 7/707; G03F 7/70708; H01L 21/6838; H01L 21/6875; H01L 21/68757; H01L 21/68735
USPC ................................. 355/53, 72, 75
See application file for complete search history.

(56) References Cited

U.S. PATENT DOCUMENTS 5,411,769 A * 5/1995 Hornbeck ...................... 427/534
5,535,090 A * 7/1996 Sherman ....................... 361/234

(Continued)

FOREIGN PATENT DOCUMENTS

EP    1 840 657 A1    10/2007
JP    2-149714 A    6/1990

(Continued)

OTHER PUBLICATIONS

Search Report for International Application No. PCT/NL2007/050657 mailed Apr. 16, 2008, 4 pgs.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus includes an illumination system constructed and arranged to condition a radiation beam, and a support constructed and arranged to support a patterning device. The patterning device is capable of imparting the radiation beam with a pattern in its cross-section to form a patterned radiation beam. The apparatus also includes a substrate table constructed and arranged to hold a substrate, and a projection system constructed and arranged to project the patterned radiation beam onto a target portion of the substrate. The substrate table includes a chuck having a plurality of protrusions constructed and arranged to support corresponding parts of a bottom surface of a wafer. The top surface of at least one of the protrusions includes a plurality of elements that define a reduced contact area between the substrate and the top surface of the protrusion.

17 Claims, 5 Drawing Sheets

(56) References Cited

U.S. PATENT DOCUMENTS

| | | | |
|---|---|---|---|
| 5,903,428 A * | 5/1999 | Grimard et al. | 361/234 |
| 5,923,408 A | 7/1999 | Takabayashi | |
| 6,307,620 B1 | 10/2001 | Takabayashi et al. | |
| 6,556,414 B2 | 4/2003 | Kosakai | |
| 6,839,217 B1 | 1/2005 | Larsen | |
| 7,050,147 B2 | 5/2006 | Compen | |
| 7,791,708 B2 | 9/2010 | Puyt et al. | |
| 2002/0036373 A1 | 3/2002 | Kosakai | |
| 2005/0024620 A1 * | 2/2005 | Van Empel et al. | 355/72 |
| 2005/0030501 A1 | 2/2005 | Mulkens et al. | |
| 2005/0039618 A1 | 2/2005 | Heidari et al. | |
| 2005/0095833 A1 * | 5/2005 | Lutz et al. | 438/597 |
| 2005/0167036 A1 | 8/2005 | Yokoyama et al. | |
| 2006/0006340 A1 | 1/2006 | Compen | |
| 2006/0076637 A1 * | 4/2006 | Gally et al. | 257/433 |
| 2007/0217114 A1 * | 9/2007 | Sasaki et al. | 361/145 |

FOREIGN PATENT DOCUMENTS

| | | |
|---|---|---|
| JP | 02-159744 | 6/1990 |
| JP | 06-091463 A | 4/1994 |
| JP | 7-326655 A | 12/1995 |
| JP | 10-12714 A | 1/1998 |
| JP | 10-56054 A | 2/1998 |
| JP | 2000-311933 A | 11/2000 |
| JP | 2001-060618 A | 3/2001 |
| JP | 2001-341043 A | 12/2001 |
| JP | 2006-024954 A | 1/2006 |
| KR | 2003-0057977 A | 7/2003 |

OTHER PUBLICATIONS

Non-Final Rejection mailed Dec. 24, 2009 for U.S. Appl. No. 11/645,812, 10 pgs.

Notice of Allowance directed to related U.S. Appl. No. 11/645,812, filed Dec. 27, 2006, mailed May 27, 2010; 7 pages.

Japanese Notice of Reasons for Rejection directed to related Japanese Patent Application No. 2009-543972, the Japanese Patent Office, mailed May 24, 2011; 6 pages.

English language Abstract of Japanese Patent Publication No. 06-091463 A, published Apr. 5, 1994; 1 page.

English language Abstract of Japanese Patent Publication No. 2000-311933 A, published Nov. 7, 2000; 1 page.

English language Abstract of Japanese Patent Publication No. 2001-060618 A, published Mar. 6, 2001; 1 page.

English language Abstract of Japanese Patent Publication No. 2001-341043 A, published Dec. 11, 2001; 1 page.

English language Abstract of Japanese Patent Publication No. 2006-024954 A, published Jan. 26, 2006; 1 page.

* cited by examiner

LITHOGRAPHIC APPARATUS, SUBSTRATE TABLE, AND METHOD FOR ENHANCING SUBSTRATE RELEASE PROPERTIES

CROSS REFERENCE TO RELATED APPLICATIONS

This is a continuation of U.S. patent application Ser. No. 11/645,812, filed Dec. 27, 2006 (that issued as U.S Pat. No. 7,791,708 on Sep. 7, 2010), which is incorporated herein by reference in its entirety.

BACKGROUND

1. Field of the Invention

The present invention relates to a lithographic apparatus, a substrate table, and a method for enhancing substrate release properties of a substrate table.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During operation in a lithographic apparatus, a substrate may be clamped to a substrate table that includes a chuck that has a plurality of burls for supporting corresponding parts of a bottom section of the substrate. In order to strive towards optimal fixation during a lithographic process, which is very position sensitive, the chuck is provided with a clamping device, such as an electrostatic clamp or a vacuum system, or geometric clamp surfaces, such as burls.

However, after the lithographic process is finished, the substrate is released from the substrate table for further processing in a different phase of the lithographic process. Due to the activation of the clamping device, the substrate tends to stick to the substrate table, even though the clamping device has been de-activated. This sticking effect may be due to adhesion forces between the bottom section of the substrate and the top section of the supporting burls, as well as to electrostatic forces generated by residual electrostatic charges. Adhesion forces may be generated by material impurities, and roughness imperfectness of the contacting surfaces.

The undesired sticking effect may be counteracted by providing a pressurized gas between the bottom section of the substrate and the top section of the supporting burls. However, this method may not exhibit reliable results, and may cause damage to the substrate and/or burls of the substrate table. Substrates may slip over the burls, thereby causing wear on the burls, which may lead to more sticking forces and fixation performance degradation. In the process of loading a substrate on a sticky burl, overlay and contamination degradation may occur, because horizontal movement of the substrate may be hindered.

JP 2159744 discloses a mechanism for asymmetrically lifting a substrate from the substrate table by means of a substantially centrally located knock-out pin and a swing cam positioned near a peripheral edge of the substrate. The lifting structure aims at peeling the substrate from the substrate table. However, in this peeling process, breakage of the substrate may occur, thereby leading to an undesired reduction in the production yield of substrates.

SUMMARY

It is desirable to provide a more reliable substrate table for releasing a wafer from a substrate table in a lithographic apparatus.

According to an aspect of the invention, there is provided a lithographic apparatus that includes an illumination system constructed and arranged to condition a radiation beam, and a support constructed and arranged to support a patterning device. The patterning device is capable of imparting the radiation beam with a pattern in its cross-section to form a patterned radiation beam. The apparatus also includes a substrate table constructed and arranged to hold a substrate, and a projection system constructed and arranged to project the patterned radiation beam onto a target portion of the substrate. The substrate table includes a chuck having a plurality of protrusions constructed and arranged to support corresponding parts of a bottom surface of a wafer. The top surface of at least one of the protrusions includes a plurality of elements that define a reduced contact area between the substrate and the top surface of the protrusion.

According to an aspect of the invention, there is provided a substrate table for supporting a substrate in a lithographic apparatus. The substrate table includes a plurality of protrusions constructed and arranged to support corresponding parts of a bottom section of a substrate. The top surface of at least one of the protrusions includes a plurality of elements that define a reduced contact area between the substrate and the top surface of the protrusion.

According to an aspect of the invention, there is provided a method for enhancing substrate release properties of a protrusion that is comprised in a substrate table for supporting a substrate in a lithographic apparatus. The method includes providing a protrusion top surface with a plurality of elements that define a reduced contact area between the substrate and the top surface of the protrusion when the substrate is placed on top of the protrusion.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION

Figure 1:
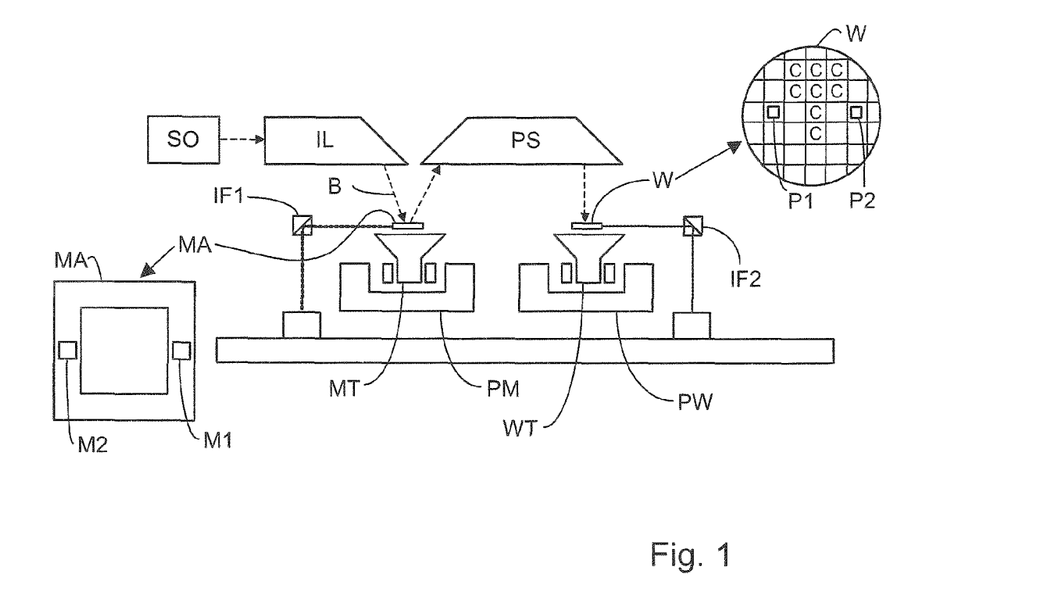
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or visible light radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF 1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
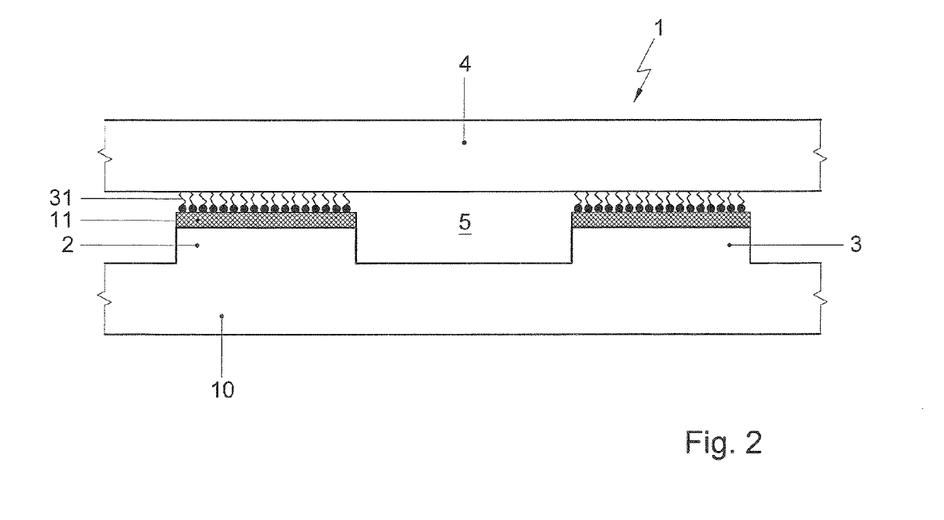
FIG. 2 depicts a substrate table of the lithographic apparatus of FIG. 1 according to a first embodiment of the invention.
Figure 3:
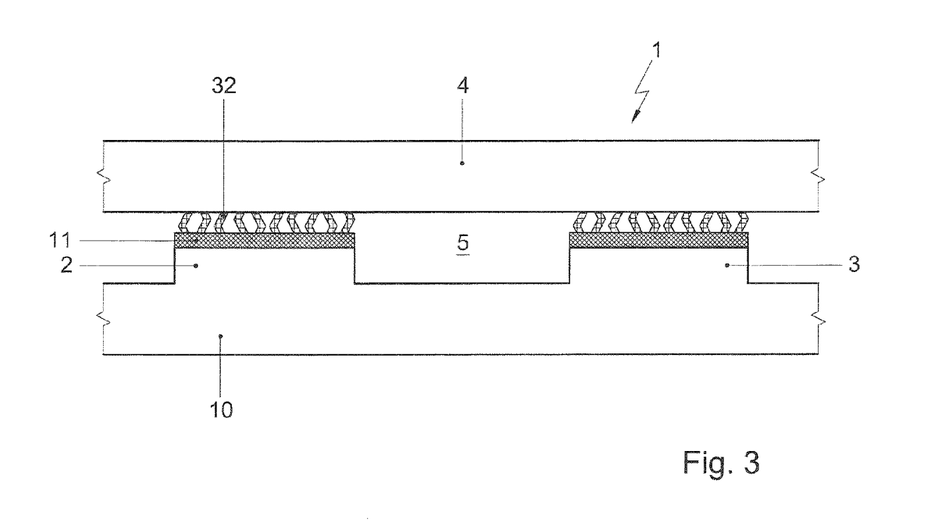
FIG. 3 depicts a substrate table according to a second embodiment of the invention.
Figure 4:
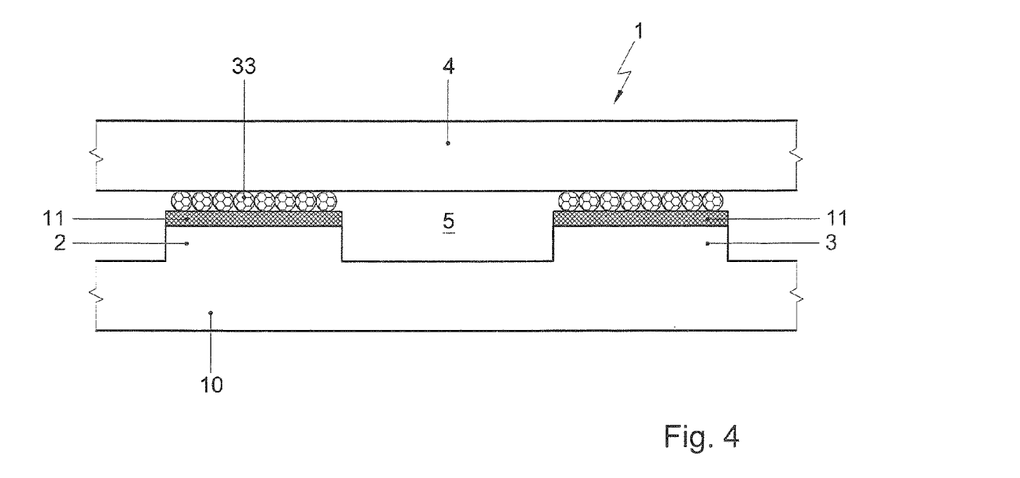
FIG. 4 depicts a substrate table according to a third embodiment of the invention.
Figure 5:
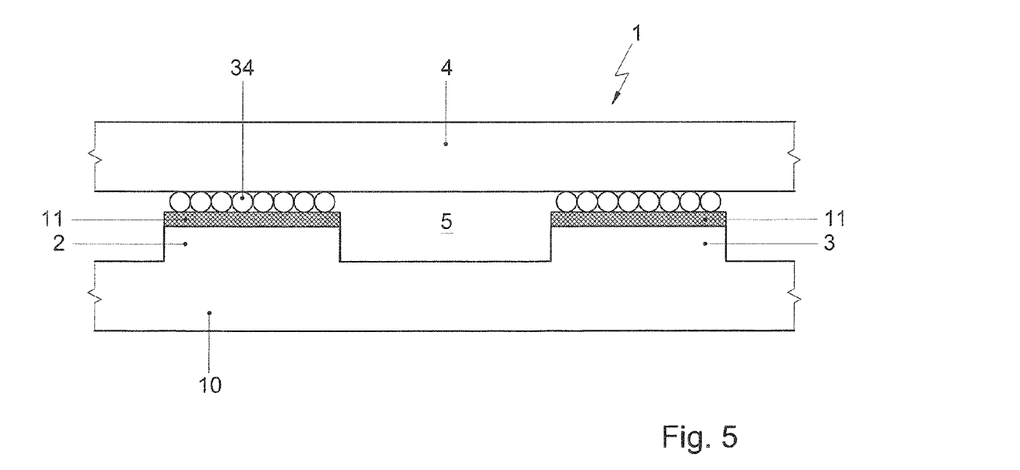
FIG. 5 depicts a substrate table according to a fourth embodiment of the invention.

FIG. 2 depicts a first embodiment of a substrate table 1 for a lithographic apparatus according to the invention. The substrate table 1 comprises a vacuum chuck, having a plurality of protrusions 2, 3, which may also be referred to as burls, for supporting a substrate 4 such as a wafer. In particular, during operation of a lithographic process, upper surfaces 11 of the burls 2, 3 contact corresponding contacting parts of a bottom surface of the substrate 4, and exert a static upwardly oriented force to the contacting parts. To ensure fixation during the process, one or more cavities 5 that are formed by the spaces between the burls 2, 3 and the lower surface of the substrate 4 are subjected to a vacuum, preferably a high vacuum. As an alternative to a vacuum, electrostatic forces may be used to fix the substrate 4 to the substrate table 1.

Once the substrate 4 is fixed to the burls 2, 3, a lithographic process can be carried out. After the lithographic process stops, the substrate may be removed to another location. Therefore, the vacuum in the cavities 5 is terminated, but remaining bonding forces, such as adhesion forces, also known as Van der Waals forces, and electrostatic forces may stick the substrate 4 to the burls 2, 3.

In order to facilitate release of the substrate 4 from the burls 2, 3, the top surface of at least one burl 2, 3 comprises a pattern of substrate-releasing micro elements, which may reduce the sticking effects discussed above. By providing a pattern of elastic micro elements, the adhesion (e.g. Van der Waals) forces acting between the substrate and burls may be reduced so that the substrate be removed after fixation relatively easily and swiftly in a reliable and controllable way. In particular, the individual elastic micro elements are squeezed during the vacuum fixation process from a stable, released state to a pressed state, so that the bottom surface of the substrate 4 substantially contacts the upper surface 11 of the burls 2, 3. After ending the high vacuum process, the elastic micro elements exert a force against the lower surface of the substrate 4, away from the upper surface 11 of the burls 2, 3, to obtain their stable, released state, thus inducing a release and/or peel off process, thereby facilitating the process of removing the substrate 4 from the burls 2, 3. As a result, a higher throughput and MTBF may be obtained.

The substrate 4 may therefore be reliably be removed from the substrate table 1 and may be transported to another part of the lithographic apparatus for further processing. As an example, the substrate 4 can be lifted by so-called a-pins (not shown) that are part of the substrate table 1, and can be taken away by a transporting device.

Preferably, the pattern of elastic micro elements comprises a substantially regular pattern of subsequent local maxima and minima heights, such that at the maxima, the resulting structure has substantially the same height. This may allow an overall clamp flatness to be maintained and the sticking of the substrate 4 to the burls/surfaces to be minimized, so that during fixation of the substrate on the chucks 2, 3, the substrate may more easily relax and overlay problems may be reduced. Further, less contamination particles are generated during the removing operation of the substrate, which may lead to less contamination of the burls, longer cleaning intervals and longer lifetimes of the substrate table.

By providing variations in the local maxima heights, the sticking effect may even be further reduced, as the effective contact area between the substrate 4 and the burls 2, 3 may be reduced while small normal forces apply.

In an embodiment, the pattern of elastic micro elements may be formed by a monolayer, so that in a relatively simple way, the above-mentioned structure of substantially regular pattern of subsequent local maxima and minima heights is obtained, thus maintaining the overall flatness of the burls. Also, the roughness of a possible burl coating just below the top monolayer may be maintained. Further, wear on the burl coating just below the top monolayer may be reduced, thereby extending its lifetime. The monolayer can be regenerated by using a chemical solution, either by hand or by using a dedicated device. Similarly, the monolayer can easily be cleaned and/or removed, either by hand or by using a dedicated device, thereby further extending the lifetime of the coating of the burls.

In FIGS. 2, 3, 4 and 5 the monolayer on top of a burl coating 1 1 is implemented as polymeric molecules 31, nano-tubes 32, bucky balls 33, and glass pearls 34, respectively. The bucky balls may comprise spherical $C_{60}$ molecules. It is noted that the monolayer might also be implemented otherwise, e.g. as a monolayer comprising metal components.

Further, it is noted that the nano-tubes 32, the bucky balls 33 and the glass pearls 34 form elastic micro elements. Optionally, the polymeric molecules 31 may also have elastic properties. However, the polymeric molecules 31 may also be formed as substantially rigid elements. The polymeric molecules 31 preferably have chemically substantially non-reacting ends, thereby providing a bearing effect between the burls 2, 3 and the substrate 4. The chemically substantially non-reacting ends of the micro elements formed by the polymeric molecules 31 is an implementation of the substrate releasing micro elements according to an embodiment of the invention. Application of chemically substantially non-reacting micro element ends may be provided instead of or in combination with elastic micro elements. Also, the nano-tubes 32 and the bucky balls 33 may have chemically substantially non-reacting ends, thereby providing the bearing effect. With respect to the glass pearls 34, it is noted that apart from the elastic effect, a reduced contact surface is obtained, thereby further reducing the sticking effect.

The monolayer may comprise different types of molecules, such as organic, aromatic, aliphatic, polar, a-polar, halogenated and/or fluorinated molecules, depending on the desired material properties.

Figure 6A:
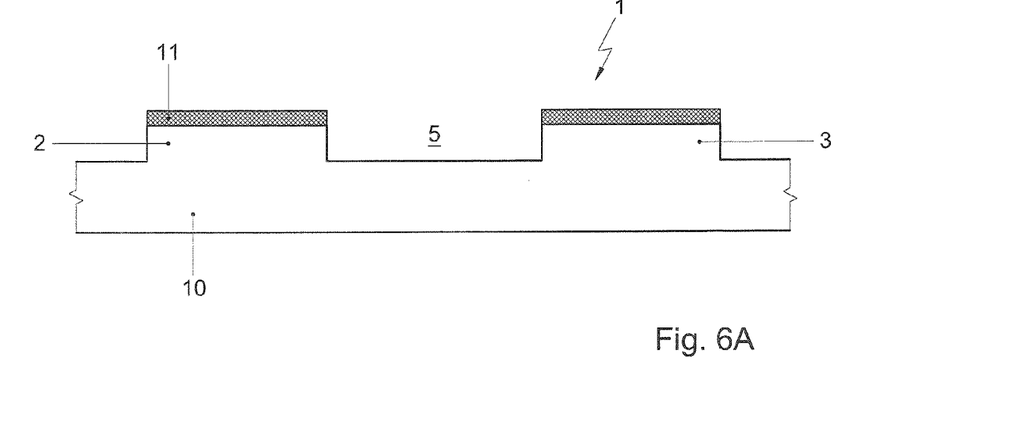
FIG. 6A depicts the substrate table of FIG. 2 before a monolayer is applied using a chemical process.
Figure 6B:
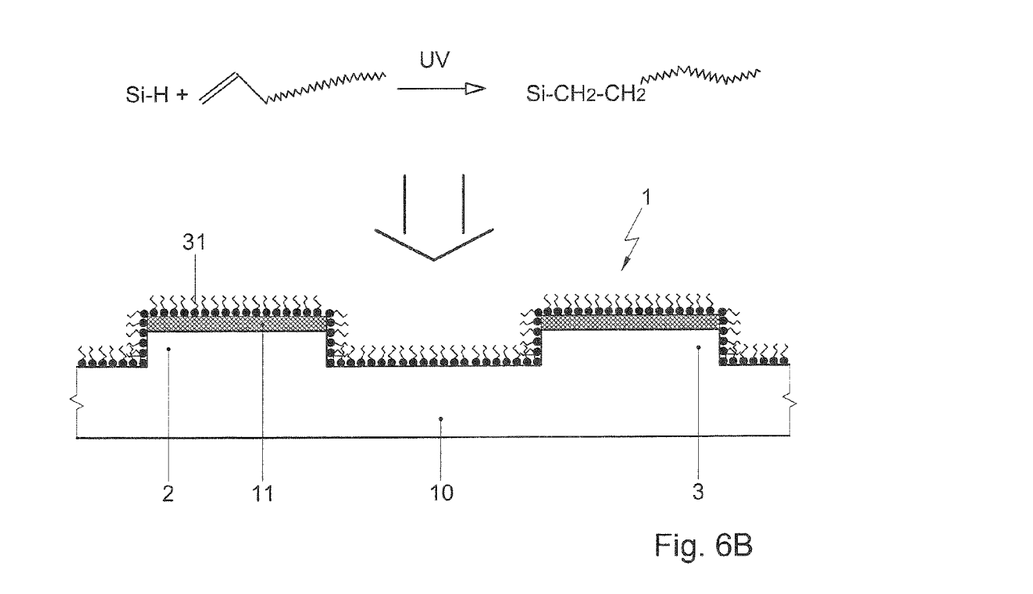
FIG. 6B depicts the substrate table of FIG. 6A after the monolayer has been applied.

In an embodiment according to the invention, a specially devised (organic) coating on top of the burls is applied by means of applying either a wet solution that contains organic molecules that are able to form under influence of a UV light source a monolayer of molecules or that react with surface Si—OH bonds under formation of a monomolecular layer. A schematic view of an embodiment of the chemical process to provide a monolayer on the substrate table is depicted in FIGS. 6A and 6B. In particular, FIG. 6A shows the substrate table before the chemical treatment, and FIG. 6B shows the substrate table after the chemical treatment.

In another embodiment according to the invention, thin anti-sticking layers are deposited via a Plasma Enhanced Chemical Vapor Deposition (PE-CVD) process in which organic molecules are used. The PE-CVD process comprises a plasma-polymerization of organic radicals on the surface of the clamp, initiated by argon ions after $O_2$-plasma-activation of the surface. In this process, a dense layer of cross linked polymer is formed. The types of polymers that may be used includes all available radical forming precursors, spanning from aromatic reach such as cross linked polystyrene-like, cross linked polysiloxanes, and cross linked Teflon-like coatings, to graphitic and diamond-like coatings.

In a further embodiment according to the invention, use is made of the evaporation and ionization of conducting materials, such as metals and/or graphite, in an electric arc, e.g. a Filtered High Current Arc, and the subsequent use of such ions to deposit a thin coating. Depending on the gaseous environment, the formation of oxides, nitrides and even Teflon (in case of use of $CF_4$) is possible.

In such processes of generating the monolayer, the formation of a thin, e.g. in the range of about 1-30 nm, and dense coating on the clamp may be achieved.

Figure 7A:
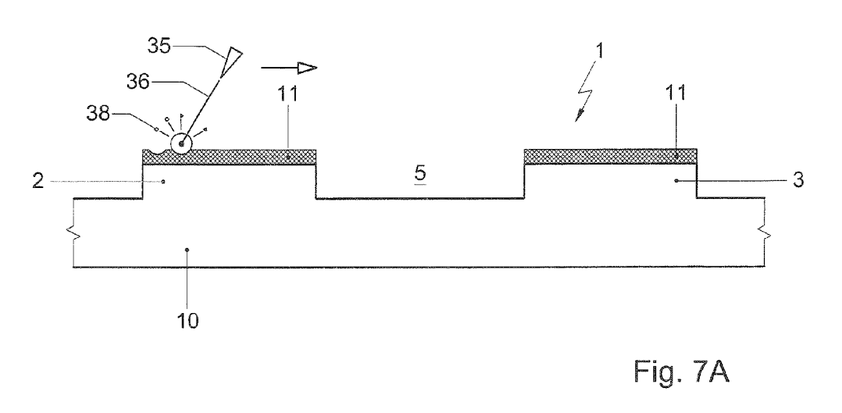
FIG. 7A depicts a substrate table according to a fifth embodiment of the invention during a manufacture process.
Figure 7B:
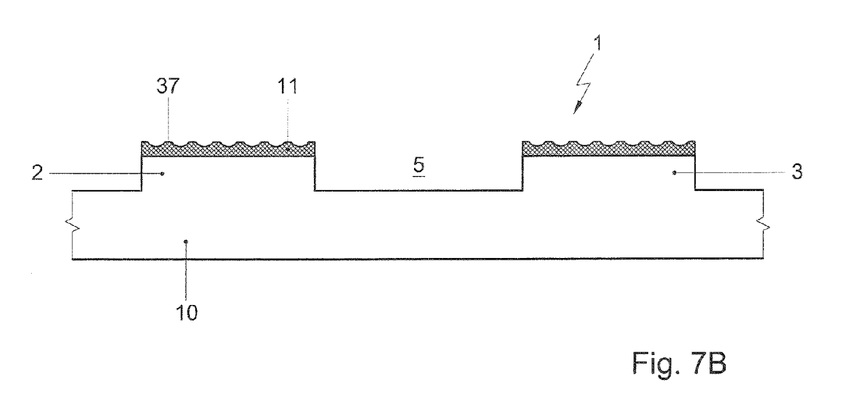
FIG. 7B depicts the substrate table of FIG. 7A after the manufacturing process.

In a further embodiment according to the invention, a laser, e.g. a low power laser such as a femto [s] laser, may be used to machine a defined pattern of elastic micro elements in the upper surface 11 of the burls 2, 3. Height differences in the upper surface 11 of the burls 2, 3 can be in the order of nanometers. However, it is also possible to apply height differences that are greater, e.g. in the order of tens of nanometers. The machined pattern of elastic micro elements can in principle be formed arbitrarily. However, structured or repeated patterns are possible, such as a golf ball pattern, shown in FIGS. 7A and 7B, or in general patterns having convex or concave top surfaces that can be spherical, circular, or elliptic. Further, edge structures can be obtained, e.g. having top edges. The machining process is schematically shown in FIG. 7A, while the resulting substrate table is shown in FIG. 7B. The machining process can be performed after a coating step on the burls, after the burl has been fabricated, by polishing, coating and/or sandblasting, for example. In doing so, the burl surface may be roughened without influencing an overall clamp flatness.

Further, it is noted that the substrate table 1 according to embodiments of the invention is not merely suited for application in a lithographic apparatus, but also in other devices, such as in an implanter or etching device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (BUY) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A substrate table for supporting a substrate comprising a first and second surface, the substrate table comprising:
   a chuck configured to clamp the substrate;
   protrusions comprising a first material coupled to the chuck to support the first surface of the substrate, wherein a first surface of at least one of the protrusions faces the first surface of the substrate; and
   a plurality of micro elements coupled to the first surface of each of the protrusions, wherein:
      each of the plurality of micro elements comprises a second material, the second material being different from the first material and having, a property of elasticity; and
      each of the plurality of micro elements comprises a cross-section having a non-cylindrical form or the plurality of micro elements comprises a cross-sectional pattern, the cross-sectional pattern comprising alternating local maxima and minima regions, the local maxima regions being in contact with the first surface of the substrate.

2. A substrate table according to claim 1, wherein the protrusions are burls.

3. A substrate table according to claim 1, wherein the micro elements comprise chemically substantially non-reacting ends.

4. A substrate table according to claim 1, wherein the micro elements are configured as a monolayer.

5. A substrate table according to claim 4, wherein the monolayer comprises bucky balls, glass pearls, polymeric molecules, or nano-tubes, or any combination thereof.

6. A substrate table according to claim 4, wherein the monolayer comprises organic, aromatic, a-polar, or fluorinated molecules, or any combination thereof 7. A substrate table according to claim 4, wherein the monolayer comprises oxide, nitride, or Teflon molecules, or any combination thereof.

8. A substrate table according to claim 1, wherein the substrate table forms a part of a lithographic apparatus.

9. A substrate table according to claim 1, wherein the substrate table forms a part of an implanter or an etching device.

10. A method for enhancing substrate release properties of a protrusion in a substrate table that is configured to support a substrate comprising a first and second surface, the method comprising:
    coupling a plurality of protrusions to a chuck of the substrate table, wherein each of the plurality of protrusion comprises a first material; and
    disposing a plurality of micro elements at a first surface of each of the plurality of protrusions of the substrate table, wherein:
       each of the plurality of micro elements comprises a second material, the second material , being different from the first, material and, having a property of elasticity; and
       each of the plurality of micro elements are formed having a non-cylindrical cross-section or the plurality of micro elements are formed having a cross-sectional pattern comprising alternating local maxima and minima regions, the local maxima regions being in contact with the first surface of the substrate.

11. A method according to claim 10, wherein the disposing comprises:
    forming a monolayer of the plurality of micro elements at the first surface of at least one of the plurality of protrusions;
    applying a plasma enhanced chemical vapor deposition (PE-CVD) or filter high current arc (F-HCA) process to generate the monolayer on the first surface of at least one of the plurality of protrusions.

12. A method according to claim 10, further comprising:
    depositing or growing a monolayer to form the plurality of micro elements on the first surface of at least one of the plurality of protrusions.

13. A method according to claim 10, further comprising:
    applying a wet solution comprising organic molecules to the first surface of at least one of the plurality of protrusions; and
    exposing the wet solution to an UV source or allowing the wet solution to chemically react with surface bonds to form a monolayer of the plurality of micro elements on the first surface of the at least one of the plurality of protrusions.

14. A method according to claim 10, further comprising:
    locally machining with a laser to form a defined pattern of the plurality of micro elements on the first surface of at least one of the plurality of protrusions.

15. A method according to claim 14, wherein the locally machining with the laser forms a defined pattern with height differences of an order of nanometers or an order of tens of nanometers.

16. A method according to claim 14, wherein the locally machining with the laser forms a defined pattern having convex or concave surfaces that are spherical, circular or elliptic.

17. A method according to claim 14, wherein the locally machining with the laser forms a defined pattern having edge structures.

* * * * *

UNITED STATES PATENT AND TRADEMARK OFFICE
CERTIFICATE OF CORRECTION

PATENT NO. : 8,792,085 B2  
APPLICATION NO. : 12/856106  
DATED : July 29, 2014  
INVENTOR(S) : Puyt et al.

Page 1 of 1

It is certified that error appears in the above-identified patent and that said Letters Patent is hereby corrected as shown below:

IN THE CLAIMS:

Column 10, line 12, claim 10, after "material" (first occurrence), please delete ",".
Column 10, line 13, claim 10, after "first", please delete ",".
Column 10, line 13, claim 10, after "and", please delete ",".

Signed and Sealed this
Twenty-seventh Day of January, 2015

Michelle K. Lee
*Deputy Director of the United States Patent and Trademark Office*